United States Patent [19]

Iwasa et al.

[11] Patent Number: 4,970,354

[45] Date of Patent: Nov. 13, 1990

[54] ELECTROMAGNETIC WAVE SHIELDING CIRCUIT AND PRODUCTION METHOD THEREOF

[75] Inventors: Yamahiro Iwasa; Isao Morooka, both of Hachioji; Yoichi Oba, Higasiyamato, all of Japan

[73] Assignee: Asahi Chemical Research Laboratory Co., Ltd., Tokyo, Japan

[21] Appl. No.: 313,083

[22] Filed: Feb. 21, 1989

[30] Foreign Application Priority Data

Feb. 21, 1988 [JP] Japan .................................. 63-37798

[51] Int. Cl.$^5$ ............................................... H05K 1/00
[52] U.S. Cl. ...................................... 174/257; 427/96; 427/98
[58] Field of Search ................. 174/68.5, 257; 427/96, 427/98

[56] References Cited

U.S. PATENT DOCUMENTS

| | | | |
|---|---|---|---|
| 4,072,771 | 2/1978 | Grier, Sr. ....................... | 174/68.5 X |
| 4,248,921 | 2/1981 | Steigerwald et al. ......... | 174/68.5 X |
| 4,684,550 | 8/1987 | Milius et al. ..................... | 427/98 X |
| 4,734,156 | 3/1988 | Iwasa ..................................... | 427/98 |
| 4,801,489 | 1/1989 | Nakagawa et al. ............... | 427/96 X |

*Primary Examiner*—Morris H. Nimmo
*Attorney, Agent, or Firm*—Robert F. Ziems

[57] ABSTRACT

An electromagnetic wave shielding circuit and the production method thereof is described, wherein the circuit comprises a base board, an electric circuit formed on the base board, an electrically isolating coating coated over the electric circuit, a layer of coating having copper particles contained therein coated over the electrically isolating coating and hardened by heating, a copper plating layer attached to the surface of the copper particle containing coating for discharging out of the electric circuit an electromagnetic wave current which may be produced in the electric circuit, said copper particle containing coating having contained therein 100% by weight of copper particles and 12%–25% by weight of epoxy resin for a binder.

2 Claims, 4 Drawing Sheets

ELECTROMAGNETIC WAVE SHIELDING CIRCUIT AND PRODUCTION METHOD THEREOF

BACKGROUND OF THE INVENTION

The invention relates to electromagnetic wave shielding circuits and production thereof, wherein the electromagnetic wave shielding effect is excellent and the shielding circuits are securely fixed to a base board, and moreover the practical use may be highly appreciated.

It is generally known that the various electric or electronic instruments will produce electromagnetic waves to give an adverse influence such as the electromagnetic interference to other electric or electronic instruments. In fact, the legal regulation of such electromagnetic interference has been recently severe in many countries. The electromagnetic waves are such waves as are flowing in the space around us and are widely commercialized in the range of broadcast from a low frequency of the radio electromagnetic waves to an extremely high frequency of the space satellites. Such commercialized electromagnetic waves around us are legally regulated so as not to cause the electromagnetic interferences. There are, however, some instruments which may inevitably radiate or leak considerably strong electromagnetic waves. Such instruments are generally required to have means provided for shielding the electromagnetic waves as described, for example, in a Japanese periodical Function Materials, June issue 1984, pages 22–23.

Recently various function materials have been proposed for shielding the electromagnetic waves. These function materials are, however, not so effective as the widely employed metal plate enclosure shielding with respect to the usability and endurance. Other materials proposed are not preferable, for example, such as a ceramics of ferrite, a plastic of polystyrene, a polystyrene containing copper filler, an electrically conductive coating material to be flame-coated, vacuum-deposited, spattered or reduction-treated, a metal foil to be adhered, a resin to be coated, a metal to be meshed, etc.. For example, the polystyrene represents at most 15dB against the electromagnetic waves of frequency 600 MHz, which is the minimum effect for shielding the electromagnetic waves. Concerning the polystyrene containing copper filler, the shield effect is best, that is, about 55dB at about the frequency 500 MHz, and the shield effect is at most 25dB at the frequency 1 kHz and 1 GHz.

The mentioned Function Materials, June issue, 1984, P. 24 indicates the shield effect (SE) in the unit of decibel (dB) as follows;

$$Se = 20 \log \frac{\text{incidence field strength (V/m)}}{\text{transmission field strength (V/m)}}, \text{ and}$$

the levels of shield effect (SE) are by way of experience,

0dB ~10dB almost no shield effect may be confirmed,
10dB ~30dB : minimum shield effect may be confirmed,
30dB ~60dB : average shield effect may be confirmed,
60dB ~90dB : considerably high shield effect may be confirmed,
over 90dB : shield effect by way of a best technique.

In compliance to the legal regulations, in many countries, the materials with a shield effect of about 40dB~50dB may be practically used.

Figure 7:
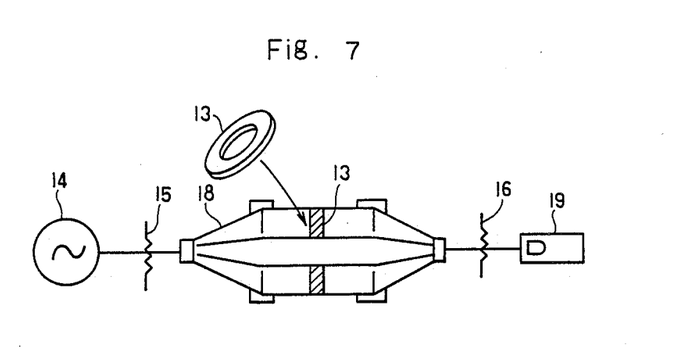
FIG. 7 is an explanatory outlined view of a coaxial transmission line metal for measuring the electromagnetic wave shielding effect as shown by way of example.
Figure 9:
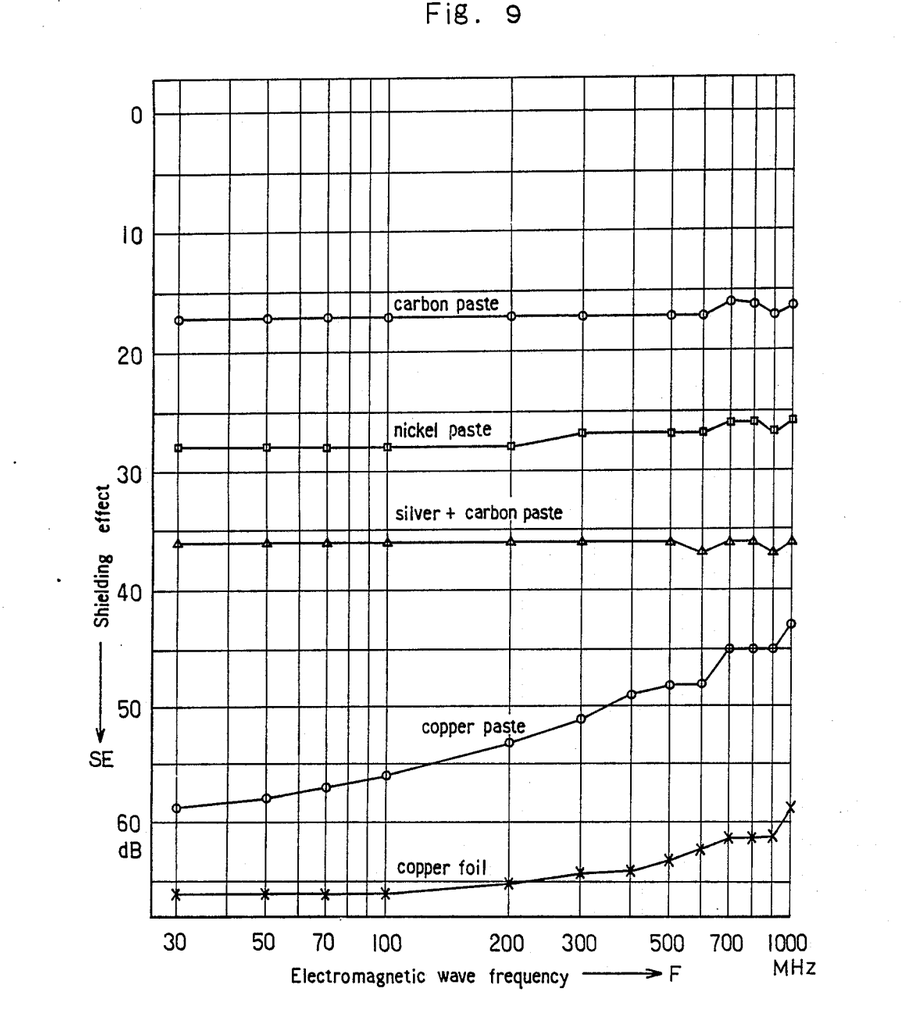
FIG. 9 is a linear representation of an electromagnetic wave shielding effect in accordance with the conventional electromagnetic wave shielding function materials.

The inventors asked the Tokyo Metropolitan Industrial Center to measure the shield effect (SE) of the various function materials as shown in FIG. 9 by way of the coaxial transmission line method as shown in FIG. 7. As the result, the carbon paste (20Ω/□) is about 17dB which is stabilized against the frequency F; the nickel paste ($10^{-2}$-□-cm) is about 26dB~28dB which is a little lower against the frequencies of more than 700 MHz; the silver and carbon paste (1.0 Ω/□) is about 36dB which is stabilized against the frequency F; the copper paste (0.1 Ω/□) is of a shield effect which is lower as the frequency F increases, that is, the shield effect is about 58dB against the frequency 30 MHz, which is of a desired value, but is lower down to 43dB against 1000 MHz. As to the aluminium foil, though not shown, the shield effect of about 45dB 65dB may be obtained, and it is confirmed that the shield effect will increase up to about 60dB as the frequency F increases. But such a value is still not sufficient.

Japanese utility model application published as 55-4246 discloses an electromagnetic wave shield by way of making copper plating on a coating having electrically conductive copper particles. According to this method, it is required that the coating containing electrically conductive copper particles has a high electric conductivity, and has a phenol resin contained therein as a binder.

However according to the experiments made by the present inventors, 10% by weight of phenol resin against 100% by weight of copper particles will make the coating practically useless because the coating is dissolved into the plating solution, and further 20% by weight of phenol resin is not enough to secure a sufficient adherence force to the copper foil after plating and to the base material. In any event, it is apparent that the phenol resin is practically useless to be used as a binder as shown in Table 1. There are no other electromagnetic wave shielding techniques proposed for realizing an excellent shielding effect by making a copper plating on the coating containing copper particles, in which the binder is effective to sufficiently adhere to the copper foil and to the base material in the initial stage of plating and after thereof.

OBJECTS OF THE INVENTION

The present invention has been provided to eliminate the defects and disadvantages of the prior art. It is therefore an object of the invention to provide a copper particle contained coating layer which is treated by way of chemical copper plating, the coating having contained therein 100% by weight of copper particles and 12%–25% by weight of epoxy resin, so as to secure a stabilized shielding effect which is more than 66dB in the range of electromagnetic wave frequency 30-100 MHz. It is another object of the invention is to use the copper particle contained coating so as to provide an electromagnetic wave shielded circuit which is of a very desired property in the adherence in the initial stage of plating as well as after thereof to be applied an electrically isolating film covered over the electric circuit and to further provide the electromagnetic wave shielded circuit of a desired property for sufficiently resisting the heat of melted solder as well as for plating deposition. It is still another object of the invention to use a coating having contained therein 100% by weight of copper particles and 20% by weight of epoxy resin to provide a desired electromagnetic wave shielding effect for an electric circuit, and also to attain the objects as mentioned above.

SUMMARY OF THE INVENTION

In short, the present invention comprises a base board, an electric circuit formed on the base board, an electrically isolating coating coated over the electric circuit, a layer of coating having copper particles contained therein coated over the electrically isolating coating and hardened by heating, a copper plating layer attached to the surface of the copper particle containing coating having containing therein 100% by weight of copper particles and 12%-25% by weight of epoxy resin for a binder; another aspect of the invention comprises a coating having contained therein 100% by weight of copper particles and 20% by weight of epoxy resin; another aspect of the invention is a print circuit base board comprising an electric circuit formed on a base board, an electrically isolating coating coated over the electric circuit, a layer of coating having copper particles contained therein coated over the electrically isolating coating and hardened by heating, a copper plating layer attached to the surface of the copper particle containing coating for discharging out of the electric circuit an electromagnetic wave current which may be produced in the electric circuit, said copper particle containing coating having contained therein 100% by weight of copper particles and 12-25% by weight of epoxy resin for a binder; and another aspect of the invention comprised the steps of forming an electric circuit on a base board, coating an electrically isolating coating on all over the electric circuit and hardening the coating by heating to thereby form an electrically isolating film on the electric circuit, coating on the electrically isolating film a coating having contained therein 100% by weight of copper particles and 12%-25% by weight of epoxy resin and hardening the copper particle containing coating by heating to thereby form a copper particle contained coating layer on the electrically isolating film, pretreating the so processed base board and then treating the surface of the copper particle contained coating layer by way of chemical copper plating to form thereon a chemical copper plating layer for discharging out of the electric circuit an electromagnetic wave current which may be produced in the electric circuit.

BRIEF DESCRIPTION OF THE DRAWINGS:

FIGS. 1 through 8 show an embodiment of the present invention, in

DETAILED DESCRIPTION OF THE INVENTION

Figure 4:
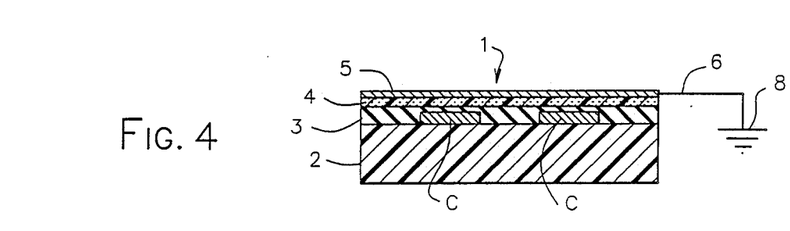
FIG. 4 is a chemical copper plating layer formed on the copper particle containing coating layer of FIG. 3 shown in vertical section.

The invention is described in reference to a preferred embodiment as shown in the attached drawings, in which, the electromagnetic wave shielding circuit 1 of the invention is composed of a base board 2, electric circuits C formed on the base board 2, an electrically isolating film 3, a layer 4 of copper particle contained coating and a layer 5 of chemical copper plating, all of which are laminated as shown in FIG. 4.

The base board 2 may be a board such as a glass epoxy base board. The electric circuits C may be the circuits formed as etched in a subtractive method on a copper foil attached to the base board 2 or formed as by a chemical copper plating in an additive method on an electrically conductive copper paste coated on the base board. It is needless to say that the circuits C may be of precious metals such as gold and silver.

The electrically isolating film 3 is used to cover the electric circuits C to prevent the circuits from shortcircuiting each other and further to prevent the circuits from short-circuiting the copper particle contained coating layer 4 to be formed on the circuits.

The copper particle contained coating layer 4 is a copper particle contained coating coated on the electrically isolating film 3 and hardened by heating and then is to be treated with chemical copper plating to deposit the copper particle nucleuses therein.

The chemical copper plating layer 5 is formed on the copper particle contained coating layer 4 to discharge out of the circuits C the electromagnetic wave current which may be produced in the circuits. The layer 5 is therefore connected to an outer chassis (not shown) or grounded to the earth 8 by way of a lead 6.

According to the invention, the copper particle contained coating layer 4 is composed of 100% by weight of copper particles and 12%-25% by weight of epoxy resin mixed with each other. Such mixing rates are, as shown in FIG. 6 wherein the vertical axis 10 is full evaluation, required to define a range in which to maintain a desired adherence to a base material such as the electrically isolating film 4 and a desired deposition of the chemical copper plating.

The tests have been made in connection with the other materials such as phenol resin, phenol resin +nitrile rubber, xylene resin and polybutadiene resin +melamine resin. The tests, however, have proved that none of these have a sufficient adherence property to the base material and have a desired deposition of chemical copper plating.

In short, the epoxy resin used in the invention is most desired with respect to adherence to a base material and deposition of the chemical copper plating as shown in Table 1. Especially it has been found that a mixture of 100% by weight of copper particles and 20% by weight of epoxy resin for a binder is most desired when considered in the balance of adherence to a base material and deposition of chemical copper plating. In Table 1, the initial adherence to a copper foil and to a base material is best (502), ⊙ best is the heat resistance for 5 sec. against the melted solder of 260° C., best ⊙ is the adherence to a copper foil and a base material after plating and further best ⊙ is the deposition of chemical copper plating.

Figure 6:
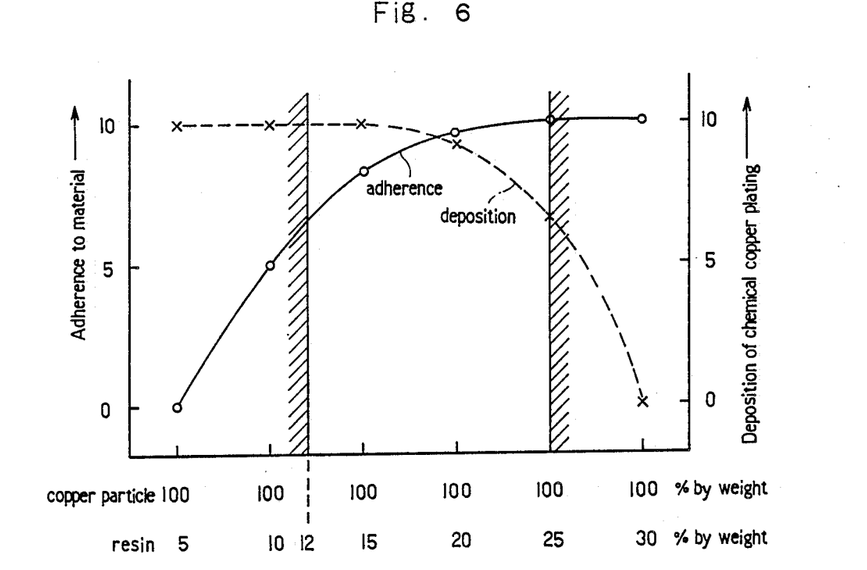
FIG. 6 is a linear drawing representing a mixing rate of epoxy resin relative to a copper particle containing coating, the adherence of the latter to a base board and the copper plating position of the coating.

As shown with the marks X and a broken line in FIG. 6, the deposition of chemical copper plating decreases as the mixing rate of resin increases in connection with 100% by weight of copper particles. It is noted that the chemical copper plating deposition decreases remarkably at the point of 25% by weight of resin. As is shown, the mixture containing more than 25% by weight of resin is practically useless. Further as shown with the marks 0 and a solid line in FIG. 6, the adherence to a base material is progressively better as the mixing rate of resin increases from 5% to 30% by weight in reference to 100% by weight of copper particles. As shown, 30% by weight of resin is best. It has been found that less than 12% by weight of resin will remarkably decreases the adherence and is practically useless. As shown, it is apparent that the range of 12%–25% by weight of epoxy resin is the one for reducing the epoxy resin to practice in both phases of desired adherence to a base material and desired deposition of chemical copper plating. It is practically difficult to use the epoxy resin in the outside of this range. According to the invention, it is therefore required to use a mixture of 100% by weight of copper particles and 12%–25% by weight of epoxy resin, and a most desired mixture is 100% by weight of copper particles and 20% by weight of epoxy resin.

Further in reference to Table 1, description is as follows concerning the phenol resin which was regarded as being desirable in prior art as a binder in connection with copper particles (Japanese utility model application published as 55-4246): In case 10% by weight of phenol resin is mixed with 100% by weight of copper particles, the initial adherence to a copper foil and to a base material and the heat resistance against melted solder are as good as shown with a mark (0), but the adherence to a copper foil and a base material after plating and the chemical copper plating deposition are not good and practically useless because the binder is dissolved into the plating solution of pH14 and 70° C. while the binder is immersed in the solution for 6 hours. In case 20% by weight of phenol resin is mixed, the initial adherence to a copper foil and to a base material and the chemical copper plating deposition are best as shown with a mark and the heat resistance against melted solder is good (0), but the adherence to a copper foil after plating is not good

TABLE 1

| Binder | Amount | Initial adherence Copper foil | Initial adherence Base material | Heat resistance against solder (26° C. & 5 sec.) | Adherence after plating Copper foil | Adherence after plating Base material | Deposition of plating |
|---|---|---|---|---|---|---|---|
| Phenol resin | 10.0 | O | O | O | Dissolved with plating solution | | ⊙ |
|  | 20.0 | ⊙ | ⊙ | O | X | Δ | ⊙ |
| Phenol resin Nitrile rubber | 10.0 | O | O | Δ | Dissolved with plating solution | | ⊙ |
|  | 20.0 | ⊙ | ⊙ | O | Δ | Δ | ⊙ |
| Xylene resin | 10.0 | O | O | Δ | Dissolved with plating solution | | ⊙ |
|  | 20.0 | ⊙ | ⊙ | ⊙ | X | Δ | ⊙ |
| Polybutadien resin Melamine resin | 10.0 | X | O | X | Δ | O | X |
|  | 20.0 | Δ | O | Δ | Δ | O | Δ |
| Epoxy resin | 10.0 | Δ | O | X | Δ | O | O |
|  | 20.0 | ⊙ | ⊙ | ⊙ | ⊙ | ⊙ | ⊙ |

Amount: % by weight for 100% by weight of copper particles.
Plating condition: Immersed for 6 hours in chemical copper plating solution of pH14 and 70° C.

as shown with a mark (X) and the adherence to a base material after plating is not sufficient as shown with a mark (Δ), and as the result, the phenol resin is practically useless.

In case 10% by weight of phenol resin + nitrile rubber is mixed with 100% by weight of copper particles, the initial adherence to a copper foil and to a base material is good (0), but the heat resistance against solder is not sufficient (Δ) because the binder is dissolved into the plating solution and is practically useless. In case 20% by weight of phenol resin + nitrile rubber is mixed, the initial adherence to a copper foil and to a base material and the chemical copper plating deposition are best ⊙ and the heat resistance against melted solder is good (0), but the adherence to a copper foil and to a base material after plating is not sufficient ⊙ and is practically useless.

In case 10% by weight of xylene resin is mixed with 100% by weight of copper particles, the initial adherence to a copper foil and to a base material is good (O), but the heat resistance against melted solder is not sufficient (Δ) and the binder is dissolved into the plating solution and is practically useless. In case 20% by weight of xylene resin is mixed, the initial adherence to a copper foil and to a base material is best ⊙, but the adherence to a copper foil after plating is not good (X) and the adherence to a base material after plating is not sufficient (Δ) and is practically useless.

In case 10% by weight of polybutadiene resin + melamine resin is mixed with 100% by weight of copper particles, the initial adherence to a base material and the adherence to a base material after plating are good (O), but the initial adherence to a copper foil and the heat resistance to melted solder are not good (X) and the adherence to a copper foil after plating is not sufficient (Δ) and is practically useless. In case 20% by weight of polybutadiene resin + melamine resin is mixed, the initial adherence to a base material and the adherence to a base material after plating are good (O), but the initial adherence to a copper foil and the adherence to a copper foil after chemical copper plating are not sufficient and is practically useless.

As mentioned above in reference to Table 1, the various resins other than the epoxy resin are practically useless when considered in both phases of the adherence to a base material and the chemical copper plating deposition. The epoxy resin only is practically useful with the range of 12%-25% by weight in connection with 100% by weight of copper particles.

Figure 1:
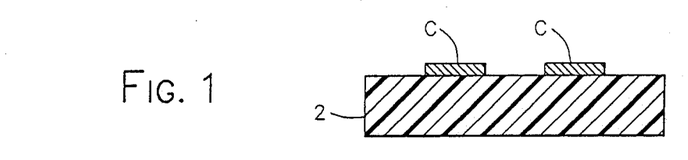
FIG. 1 is an electric circuit formed on a base board shown in section.

Now in reference to FIGS. 1 through 5, a method for producing the electromagnetic wave shielding circuit 1 will be described: First of all, as shown in FIG. 1, electric circuits C are formed on a base board 2 by way of a subtractive or additive method.

Figure 2:
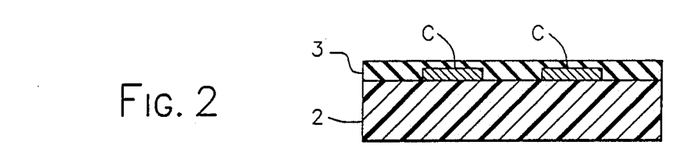
FIG. 2 is an electrically isolating film formed on the electric . 1 shown in vertical section.

An electrically isolating film 3 is then formed on all over the electric circuits C as shown in FIG. 2 in such a manner that an electrically isolating coating is coated on the circuits C and is hardened while the coating is heated with a temperature of 150° C. for 30 minutes by way of example. The electrically isolating film may be a plating resistant resist as will be explained in detail herein.

Figure 3:
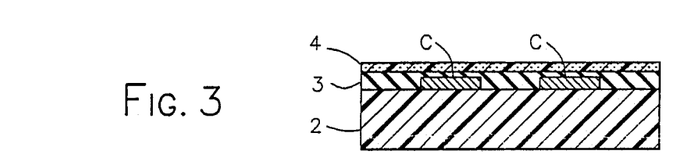
FIG. 3 is copper particle containing coating layer formed on the electrically isolating film of FIG. 2 shown in vertical section.

Then as shown in FIG. 3, a copper particle contained coating is coated on the electrically isolating film 3, the coating being a mixture of 100% by weight of copper particles and 12%-25% by weight of epoxy resin for a binder, and then is heated with a temperature of 150° C. for 30-60 minutes by way of example so as to be hardened in a form of a copper particle contained coating layer 4. The copper particle contained coating film 4 is formed not to heighten the electric conductivity thereof, but to provide a property for a chemical copper plating to be made. The electric conductivity is not a matter of importance. It is noted that in case a copper particle contained coating ACP-007P, which has been developed by Asahi Chemical Research Laboratory Co., Ltd. is used, the catalyst treatment is not needed, and the preplating treatment is applied in such a manner that the copper particle contained coating layer 4 is washed for several minutes in a water solution of 4%-5% by weight of caustic soda (NaOH) and has the surface treated for several minutes with a water solution of 5%-10% by weight of hydrochloric acid. With this preplating, the copper particles of the coating layer 4 are deposited as the nucleuses on the surface thereof for preparation of the next chemical copper plating treatment.

If a copper particle contained coating other than the above mentioned coating ACP-007P of Asahi Chemical Research Laboratory Co., Ltd. is used, the conventional catalyst treatment is needed in such a manner that the coating is treated with the catalyst solution of palladium chloride (PdC(2) and stannic chloride (SnCl$_2$) or with an alkaline catalyst solution of palladium only, and has the surface attached with the metal particles such as of the palladium as the nucleuses, so as to deposit the copper particles around the nucleuses.

After the preplating treatment has been finished, the chemical copper plating is applied to the surface of the copper particle contained coating layer 4 as shown in FIG. 4. The chemical copper plating is made in a plating bath of pH 11-14 and of a temperature 65° C.-75° C. to secure a copper plating layer 5 of more than 5 $\mu$m with a plating speed 1.5 $\mu$m -3 $\mu$m per hour. In short, the copper particle contained coating layer 4 is required to pass through the conditions of the plating bath as mentioned above. If the coating layer 4 is dissolved in the chemical copper plating bath, the coating layer 4 is practically useless. Thus the chemical copper plating layer 5 is formed on the surface of the copper particle contained plating layer 4, and the plating layer 5 is grounded by a lead 6 which is connected to the earth 8 or to an outer chassis (not shown) to discharge out of the electric circuits C the electromagnetic wave currents which may be produced in the circuits.

Figure 5:
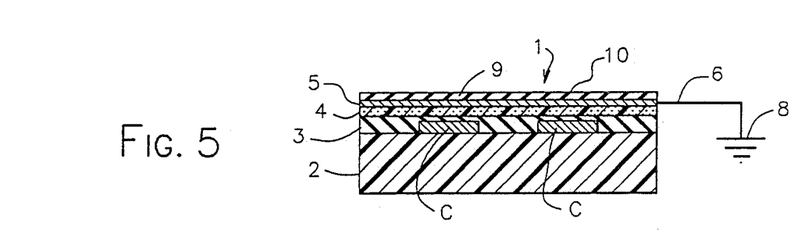
FIG. 5 is a print circuit base board shown in vertical section which is finished with an isolating film formed on copper plating layer of FIG. 4.

Actually as shown in FIG. 5, an electrically isolating film 9 is coated on the chemical copper plating layer 5 and is hardened by heat treatment for protection of the layer 5. Thus a print circuit base board 10 is finished up for practical use.

Figure 8:
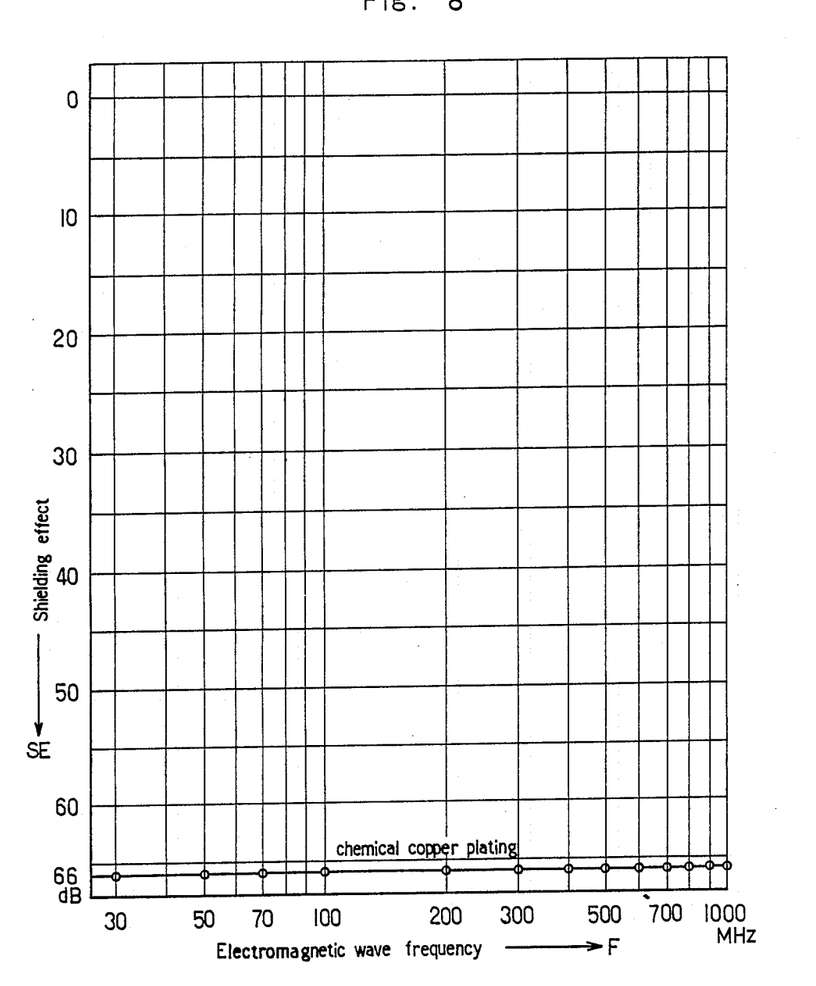
FIG. 8 is a linear representation of an electromagnetic wave shielding effect obtained by the invention.

As shown in FIG. 8, the electromagnetic wave shielding circuit 1 shows a quite stabilized electromagnetic wave shielding effect SE representing value 66dB which is just a measuring limit of a measuring device of the Tokyo Metropolitan Industrial Center as of Aug. 10, 1987 in the range of frequencies 30 MHz-1000 MHz of electromagnetic waves. It has been confirmed that the shielding effect SE of the invention is far more excellent than those of the conventionally used function materials for shielding the electromagnetic waves as shown in FIG. 9. Namely it has been found that the electromagnetic waves entering into the electromagnetic wave shielding circuit 1 from the outside are almost completely discharged out by the chemical copper plating layer 5 and the lead 6 and are therefore gives no adverse influences to the electric circuits C. Further it has been found that the electromagnetic waves which may be produced in the circuits C will be discharged out by the chemical copper plating layer 5 and the lead 6 and is thus prevented from being radiated from the circuits. It is therefore apparent that the electromagnetic wave shielding circuit 1 of the invention will be practically useful for protection against the electromagnetic wave troubles in all of the electric or electronic devices The shielding effect SE of the electromagnetic wave shielding circuit 1 is represented as 66dB in FIG. 8 because, as mentioned, the range above this shielding effect was unable to be measured by the measuring device of the Tokyo Metropolitan Industrial Center It is however possible to expect that more desired shielding effect SE will be obtained according to the present invention.

The chemical copper plating layer 5, which is a substantial portion for discharging the electromagnetic wave currents, is well adhered to the base material and is also excellent in the plating deposition because, as shown in FIG. 6, the epoxy resin is selected as a binder in connection with 100% by weight of copper particles with the selected range of mixing range 12%-25% by weight thereof. Further the best effect is obtained by designating the mixing rate to 20% by weight of epoxy resin.

The shielding effects as shown in FIGS. 8 and 9 are effects for screening the electromagnetic waves obtained by the coaxial transmission line method as shown in FIG. 7, wherein a donut-shaped jig 13 is illustrated. This method is to coat the material onto the jig 13 and to measure in comparison the electric power of the device before and after the material is coated to the device The mode (or form) of the electromagnetic waves is TEM wave (transverse electromagnetic wave) which is a planar wave having the components of the electric field and the electromagnetic field in a plane vertical to the running direction of electromagnetic waves. It is generally known that this measuring method will produce a comparatively precise value near a logic value because the material is perpendicularly inserted into the running direction of the electromagnetic waves where there are no components of electric and electromagnetic fields and there are no disorders of the electromagnetic wave mode. The coaxial transmission line method is composed of a signal generator 14, resistors 15, 16, a measuring jig 18 and spectrum analizer 19 as shown in FIG. 7.

Now detailed description is as follows with respect to the copper particle contained coating and the plating resistant resist used in the present invention:

As to the copper particle contained coating ACP-007P adapted to the copper plating and developed by Asahi Chemical Research Laboratory Co., Ltd. as a copper particle contained coating by way of example, it is generally known that copper is a metal which is easily oxidized, and especially the copper particles, which have a large surface dimension, are more easily oxidized. Therefore, in contrast to the precious metal particle contained coatings, it is desired to design a coating composition which will allow the oxidized film of copper particles to be removed and will prevent the reoxidization of the copper particles. Further in order to design a copper particle contained coating which is adapted to chemical copper plating and also easily adhered to a base material, it is important to properly select and to dispersingly knead the components such as copper particles, a binder, specific additives such as anthracene and anthracene carboxylic acid for preventing oxidization, a dispersant and a solution. According to the invention, if the catalyst treatment is made, it is not a matter of problem that the copper particles are oxidized while the coating is heated, to thereby decrease the electric conductivity. The additive for preventing oxidization is needed to properly make a chemical copper plating without making a catalyst treatment. In this sense, the copper particle contained coating ACP-007P is practically useful because this coating simply requires a preplating treatment. Further according to the invention, only the epoxy resin is effective as a binder, however, within the mixing range of 12%–25% by weight thereof in connection with 100% by weight of copper particles.

The copper particles are different in the shape and diameter thereof depending on the production of the particles. According to the electrolytic method (eloctrolytically deposit the copper particles), the copper particles of high quality in the form of branches may be provided. On the other hand, according to the reduction method (reducing the oxides by a reducing gas), particles in the form of porous sponge may be provided. However in order to form the copper particle contained coating layer 4 of the invention, it is required that the copper particle contained coating has;

1. a property excellent in the initial adherence to a copper foil and to a base material,
2. a property excellent in heat resistance against a melted solder,
3. A property excellent in adherence to a copper foil and to a base material after application of plating,
4. a property excellent in deposition of the chemical copper plating,
5. a property excellent in resistance against the alkali bath of high temperature for the chemical copper plating, and
6. a property excellent in resistance against the change of viscosity due to the lapse of time and also excellent in stabilized maintenance of printability.

In order to satisfy the above mentioned requirements, the copper particle contained coating of the invention contained a much amount of branch shaped high-quality copper particles obtained by electrolysis and fine particles in the form of porous sponge obtained by reduction of metal oxides. The copper particles processed into flakes may be used.

Further in order to highten the content rate of the copper particles in the coating, it is required to fill the copper particles of different sizes and shapes to a maximum density.

As to the binder of the copper particle contained coating, the binder is required to act as a vehicle for so much copper particles and as an effective adhesive to the base board. Further the binder must resist against the alkali bath of the chemical copper plating.

Therefore, according to the invention, the epoxy resin is employed as a binder with a large content rate of copper particles because the epoxy resin is easily adhesive to a copper foil and to a glass epoxy base board and has properties for easy plating deposition and for easy adhesion to a plating film The mixing rate of epoxy resin is, however, determined within the range of 12%–25% by weight thereof for 100% by weight of copper particles so as to be practical use.

With respect to the property of the copper plating deposited on the copper particle contained coating ACP-007, the copper plating is reddish brown and paste-like and has a viscosity of 300–500ps at the temperature of 25° C. The adhesive property to a copper foil and to a resin base board has been confirmed by a taping test. Further the adhesive property to the copper plating layer after application of copper plating has been confirmed by the taping test. The soldering property is more than 96% as to the extension rate and is more than 3.0 kg as to the tensile force ($3 \times 3$ mm$^2$).

The components of the copper particle contained coating and the conductivity thereof are mentioned in detail in the same applicant's Japanese patent applications 55-6609 (laid open: 56-103260) (corresponding U.S. Pat. No. 4353816) and 60-216041 (corresponding U S. patent application of serial No. 06/895716), and therefore the description thereof is omitted herein.

With respect to the plating resistant resist such as the resist CR-2001 developed by Asahi Chemical Research Laboratory Co., Ltd. the resist is provided so as to be used in the present invention for forming the electrically isolating film 3. Therefore the resist is required to have an electrically isolating property and at the same time an alkali resistant property. Actually the resist has been developed to maintain the acidity more than 4 hours in the alkali bath of 70° C. and of pH12 just like the copper chemical plating bath.

Similar to the copper particle contained coating ACP-007P, the resist contains as a main component an epoxy resin and is printed through a 180-mesh polyester screen and then is heated for 30 minutes at the temperature 150° so as to be hardened. The printing film is preferably 15–30$\mu$m so as to resist chemicals and voltages. The main features are as follows: The resist is easily adhered to the base on which the resist is coated, and to a copper foil and further is not deteriorated if immersed in the alkali bath of pH14 for a long time. The resist is quite safe in the practical use because the hardener to be used is alkali having little poison. The resist is coated by way of screen printing and has a hardener 10g mixed with the principal component 100g thereof, and is hardened in a set time 15–30 minutes at the temperature 150–200° C.

The plating resistant resist is green in the condition of ink and has an adhesion (cross-cut) 100/100 on a copper foil, a surface hardness of more than 8H when measured by a pencil, a solvent resistant property (in trichloroethylene) by more than 15 sec., a soldering heat (260° C.) resistant property of more than 5 cycles, a surface isolation resistance value of more than $5 \times 10^{13} \Omega$, a volume resistance value of $1 \times 10^{14} \Omega$-cm, a voltage (15μm) resistant property of more than 3.5kV and a dielectric tangent (1 MHz) of less than 0.03.

As described above, according to the invention, the electromagnetic wave shield is provided by the copper particle contained coating layer having the chemical copper plating applied thereon and having contained therein 100% by weight of copper particles as a binder and 12%–25% by weight of epoxy resin mixed each other. The shielding effect is, therefore, remarkable with a value more than 66dB stabilized in the range of the electromagnetic wave frequencies 30 MHz–1000 MHz. With the copper particle contained coating being employed, the electromagnetic wave shielding circuit is excellent in the initial adherence of plating to the electrically isolating film covering the circuit as well as in adherence after the plating treatment, and further excellent in the heat resistance against melted solder and in plating deposition. Further the electromagnetic wave shielding circuit has a most desired shielding effect with employment of the copper particle contained coating having contained therein 100% by weight of copper particles and 20% by weight of epoxy resin mixed each other.

EXAMPLE 1

Etching a copper foil attached to a glass epoxy resin base board to for electric circuits thereon, coating on the electric circuits a plating resistant resist CR-2001 developed by Asahi Chemical Research Laboratory Co , Ltd. and heating the same at the temperature 150° C. for 30 minutes to harden the same, coating on the plating resistant resist a copper particle contained coating having contained therein 100% by weight of copper particles and 20% by weight of epoxy resin as a binder mixed each other and heating the same at the temperature 150° C. for 30–60 minutes to harden the same, washing the hardened copper particle contained coating for several minutes with a water solution having 4%–5% by weight of caustic soda (NaOH) contained therein, making preplating treatment to the surface of the coating for several minutes with a water solution having 5%–10% by weight of hydrochloric acid (HCL) contained therein, immersing the so processed coating for 6 hours in the chemical copper plating bath of pH14 and of the temperature 70° C. to provide a chemical copper plating layer of more than 5 μm thick on the coating with a plating formation speed of 1.5 μm – 3 μm per hour, to thereby form an electromagnetic wave shielding circuit. The shielding effect SE of the circuit was measured by the coaxial transmission line method, and it was formed that the shielding effect reached 66dB in the range of electromagnetic wave frequencies 30 MHz – 1000 MHz, which was the value just the measuring limit of the measuring device. In fact, such a high shielding effect has never been reached by any other function materials for shielding the electromagnetic waves. Further it was confirmed that the coating may be practically useful so long as the coating is composed of 100% by weight of copper particles and 12%–25% by weight of epoxy resin.

What is claimed is:

1. An electromagnetic wave shielding circuit comprising a base board, an electric circuit formed on the base board, an electrically isolating coating overlying the electric circuit, a copper particle containing layer coated over the electrically isolating coating and hardened by heating, a copper plating layer attached to the surface of the copper particle containing layer for discharging out of the electric circuit an electromagnetic wave current which may be produced in the electric circuit, said copper particle containing layer having contained therein 100% by weight of copper particles and 12%–25% by weight of epoxy resin for a binder.

2. A method for producing an electromagnetic wave shielding circuit comprising the steps of; forming an electric circuit on a base board, coating an electrically isolating material on the electric circuit and hardening the coating by heating to thereby form an electrically isolating film on the electric circuit, coating on the electrically isolating film a composition having contained therein 100% by weight of copper particles and 12%–25% by weight of epoxy resin and hardening the copper particle containing composition by heating to thereby form a copper particle containing coating layer on the electrically isolating film, pretreating the copper particle containing layer to provide metallic nucleuses on the surface thereof and then treating the surface of the copper particle contained coating layer by way of chemical copper plating to form thereon a copper plating layer for discharging from the electric circuit on electromagnetic wave current which may be produced in the electric circuit.

* * * * *